(12) United States Patent
Jang et al.

(10) Patent No.: US 9,203,020 B2
(45) Date of Patent: Dec. 1, 2015

(54) RESISTANCE MEMORY DEVICE

(71) Applicant: Winbond Electronics Corp., Taichung (TW)

(72) Inventors: Wen-Yueh Jang, Hsinchu (TW); Ming-Chung Chiang, Changhua County (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 14/631,869

(22) Filed: Feb. 26, 2015

(65) Prior Publication Data

US 2015/0171322 A1 Jun. 18, 2015

Related U.S. Application Data

(62) Division of application No. 13/773,612, filed on Feb. 21, 2013, now Pat. No. 9,012,880.

(51) Int. Cl.
 *H01L 45/00* (2006.01)
(52) U.S. Cl.
 CPC ............ *H01L 45/1233* (2013.01); *H01L 45/04* (2013.01); *H01L 45/124* (2013.01); *H01L 45/1253* (2013.01); *H01L 45/1273* (2013.01); *H01L 45/146* (2013.01); *H01L 45/1666* (2013.01)

(58) Field of Classification Search
 CPC .............. H01L 45/1233; H01L 45/124; H01L 45/1273
 See application file for complete search history.

(56) References Cited

U.S. PATENT DOCUMENTS

| 8,206,995 | B2* | 6/2012 | Reyes | H01L 45/04 257/295 |
| 9,012,880 | B2* | 4/2015 | Jang | H01L 45/1253 257/3 |
| 2003/0116794 | A1* | 6/2003 | Lowrey | H01L 45/06 257/296 |
| 2006/0175599 | A1* | 8/2006 | Happ | G11C 13/0004 257/4 |
| 2007/0111429 | A1* | 5/2007 | Lung | H01L 45/06 438/238 |
| 2008/0142777 | A1* | 6/2008 | Park | H01L 27/2409 257/4 |

* cited by examiner

*Primary Examiner* — Joseph C Nicely
(74) *Attorney, Agent, or Firm* — Jianq Chyun IP Office

(57) ABSTRACT

Provided is a resistance memory device including a dielectric layer, a conductive layer, a bottom electrode, a top electrode and a variable resistance layer. The dielectric layer is disposed on a substrate and has a first opening constituted by a lower opening and an upper opening. The conductive layer fills up the lower opening. The bottom electrode is disposed on the bottom and on at least a portion of the sidewall of the upper opening. The top electrode is disposed in the upper opening. The variable resistance layer is disposed between the top electrode and the bottom electrode.

10 Claims, 10 Drawing Sheets

RESISTANCE MEMORY DEVICE

CROSS-REFERENCE TO RELATED APPLICATION

This application is a divisional application of and claims the priority benefit of U.S. application Ser. No. 13/773,612, filed on Feb. 21, 2013, now allowed. The entirety of the above-mentioned patent application is hereby incorporated by reference herein and made a part of this specification.

BACKGROUND OF THE INVENTION

1. Field of Invention

The present invention relates to a semiconductor device, and more generally to a resistance memory device.

2. Description of Related Art

Non-volatile memory is capable of saving stored data after the power is turned off and is thus an indispensable memory device for many electronic products to function properly. Currently, resistive random access memory (RRAM) is a type of non-volatile memory that is being actively developed in the industry. RRAM has low write-in operation voltage, short write in erase time, long memorizing time, non-destructive read out, multi-state memory, simple structure, and small required area. Consequently, RRAM has great potential in the applications in personal computers and electronic apparatuses in the future.

However, still lots of challenges need to be improved before the mass production of RRAM. One of the challenges is the variation of RRAM operation IV characteristics. The variance comes from possible multi-paths for filament formation. A wider electrode creates more possible paths for filament formation and therefore increases the variation of RRAM operation IV characteristics. In order to minimize said variation, the straightforward action is to scale down the electrode. However, due to the lithography resolution limit, it has been difficult to further narrow down the electrode.

On the other hand, at least two patterning steps are required to form a conventional RRAM. A first patterning step is performed to form a conductive plug in a dielectric layer. Thereafter, a second patterning step is performed to form a variable resistance cell constituted by a bottom electrode, a variable resistance layer and a top electrode. However, the two different patterning steps have their respective critical dimension (CD) variations. Besides, it is necessary to take the alignment error between the two different patterning steps into consideration. Both considerations increase the size of the resistance memory cell.

SUMMARY OF THE INVENTION

Accordingly, the present invention provides a resistance memory device capable of reducing the variance of IV characteristics and shrinking the size of the memory cell.

The present invention provides a resistance memory device including a dielectric layer, a conductive layer, a bottom electrode, a top electrode and a variable resistance layer. The dielectric layer is disposed on a substrate and has a first opening constituted by a lower opening and an upper opening. The conductive layer fills up the lower opening. The bottom electrode is disposed on a bottom and on at least a portion of a sidewall of the upper opening. The top electrode is disposed in the upper opening. The variable resistance layer is disposed between the top electrode and the bottom electrode. Besides, the bottom electrode is disposed on the bottom and on the entire sidewall of the upper opening.

According to an embodiment of the present invention, a sidewall of the lower opening is aligned with a sidewall of the upper opening.

According to an embodiment of the present invention, a thickness of the bottom electrode on the sidewall of the upper opening is substantially the same as a thickness of the bottom electrode on the bottom of the upper opening.

According to an embodiment of the present invention, the variable resistance layer is further disposed on the dielectric layer around the first opening.

According to an embodiment of the present invention, the dielectric layer further has a second opening, and the conductive layer further fills up the second opening.

According to an embodiment of the present invention, the first opening and the second opening penetrate through the dielectric layer.

According to an embodiment of the present invention, the variable resistance layer exposes the conductive layer within the second opening.

According to an embodiment of the present invention, the resistance memory device further includes a metal layer disposed on the dielectric layer and electrically connected to the top electrode and the conductive layer within the second opening According to an embodiment of the present invention, the conductive layer is electrically connected to another conductive layer disposed below the dielectric layer.

According to an embodiment of the present invention, the another conductive layer includes a doped region, a polysilicon layer or a metal layer.

In view of the above, since the resistance memory device of the present invention is aimed through a self-aligned process, the conventional alignment error can be avoided, and the requirement for smaller device dimension can be easily achieved. Besides, the resistance memory device of the present invention is formed with a smaller top electrode, so that the possible paths for filament formation can be reduced, and the variance of RRAM operation IV characteristics can be decreased.

In order to make the aforementioned and other objects, features and advantages of the present invention comprehensible, a preferred embodiment accompanied with figures is described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1A:
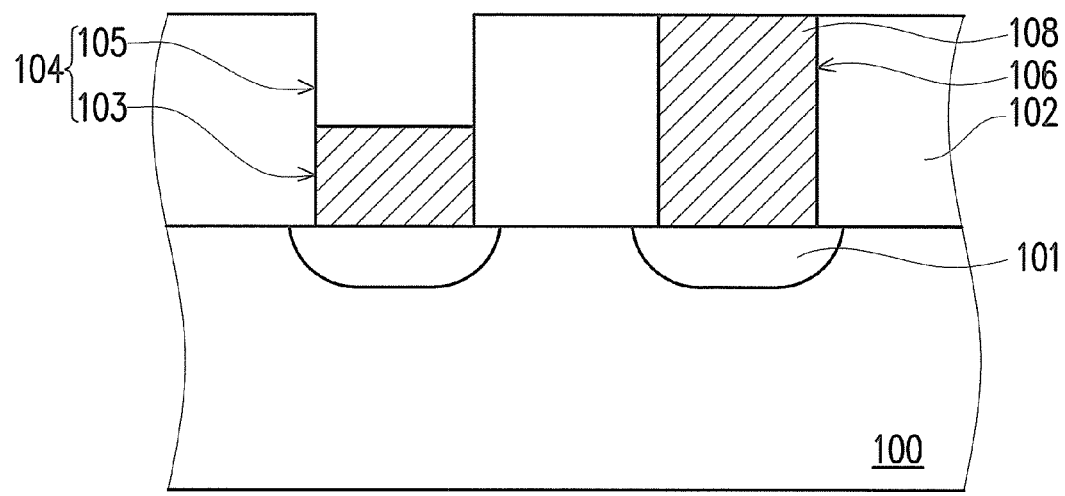
FIG. 1A to FIG. 1E schematically illustrate cross-sectional views of a method of forming a resistance memory device according to a first embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

First Embodiment

FIG. 1A to FIG. 1E schematically illustrate cross-sectional views of a method of forming a resistance memory device according to a first embodiment of the present invention.

Referring to FIG. 1A, a dielectric layer 102 is formed on a substrate 100. The substrate 100 can be a semiconductor substrate, such as a silicon substrate. The dielectric layer 102 includes silicon oxide, silicon nitride or silicon oxynitride, and the forming method thereof includes performing a chemical vapour deposition (CVD) process. Besides, the dielectric layer 102 has a first opening 104 and a second opening 106, both of which penetrate through the dielectric layer 102. The first opening 104 is constituted by a lower opening 103 and an upper opening 105, and the sidewall of the lower opening 103 is aligned with that of the upper opening 105. The method of forming the first opening 103 and the second opening 105 includes performing a photolithography/etching patterning step.

Thereafter, a conductive layer 108 fills in the first opening 104 and the second opening 106. The conductive layer 108 includes tungsten. It is noted that the conductive layer 108 fills up the second opening 106 and the lower opening 103 of the first opening 104. The method of forming the conductive layer 108 includes forming a conductive material layer (not shown) on the substrate 100, and the conductive material layer fills up the first opening 104 and the second opening 106. Thereafter, a patterning step is performed to remove the conductive material layer within the upper opening 105 of the first opening 104.

Furthermore, the conductive layer 108 can be electrically connected to another conductive layer disposed below the dielectric layer 102. In an embodiment, said another conductive layer can be a doped region 101 in the substrate 100, as shown in FIG. 1A. In another embodiment, said another conductive layer can be a polysilicon gate or a metal layer (not shown) on the substrate 100.

Figure 1B:
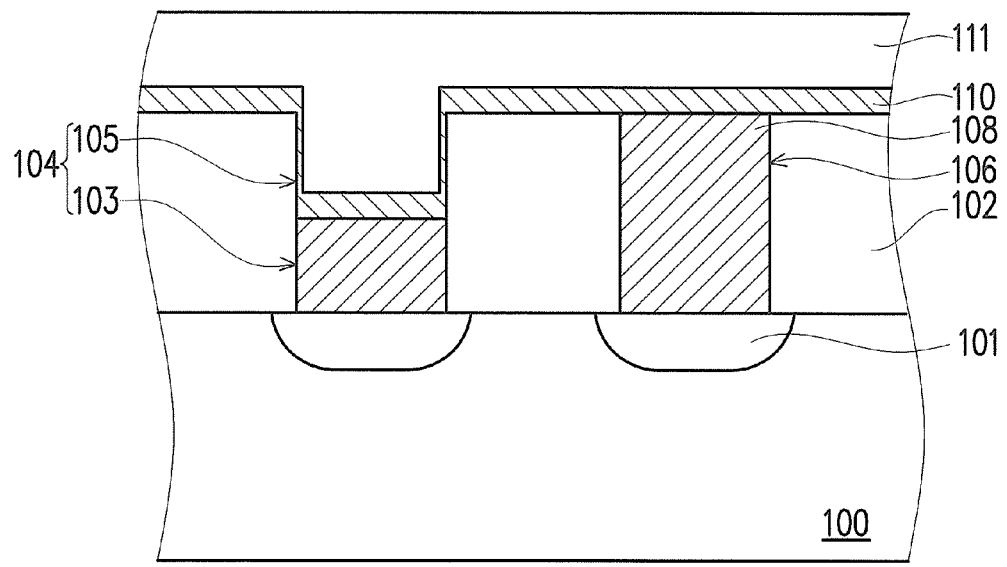

Referring to FIG. 1B, a bottom electrode material layer 110 is formed on the substrate 100. The bottom electrode material layer 110 includes titanium nitride, and the forming method includes performing a physical vapour deposition (PVD) process. Due to the step coverage effect of the PVD process, the thickness of the bottom electrode material layer 110 on the sidewall of the upper opening 105 is less than that on the bottom of the upper opening 105. Thereafter, a sacrificial layer 111 is formed on the dielectric layer 111 filling in the upper opening 105. The sacrificial layer 111 includes photoresist or silicon oxide.

Figure 1C:
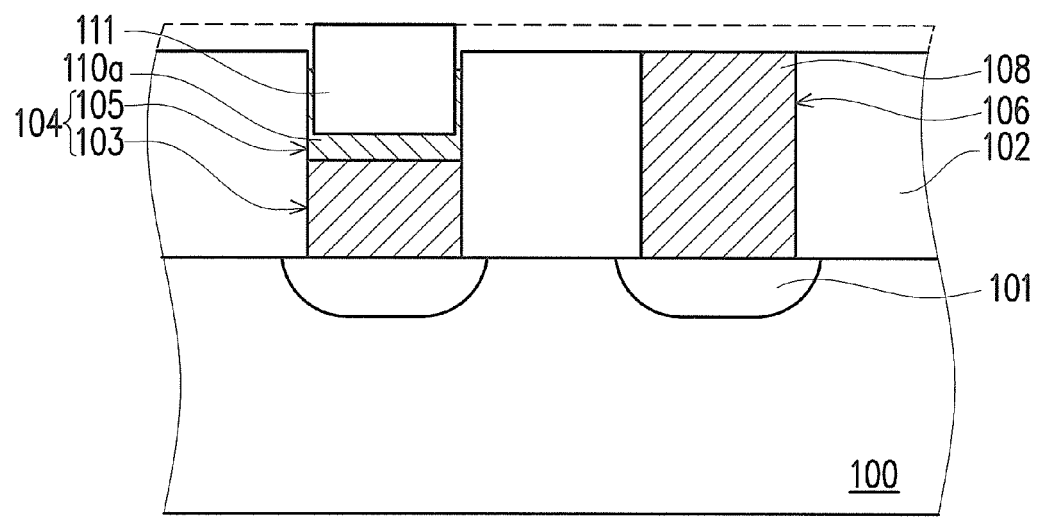

Referring to FIG. 1C, a portion of the sacrificial layer 111 is removed until the top surface of the bottom electrode material layer 110 is exposed. The method of removing the portion of the sacrificial layer 111 includes performing a chemical mechanical polishing (CMP) process. Thereafter, a portion of the bottom electrode material layer 110 is removed to faun a bottom electrode 110a. The bottom electrode 110a exposes the top surface of the dielectric layer 102 and the top portion of the sidewall of the upper opening 105. The method of removing the portion of the bottom electrode material layer 110 includes performing a wet etching process. Afterwards, the remaining sacrificial layer 111 is removed.

Figure 1D:
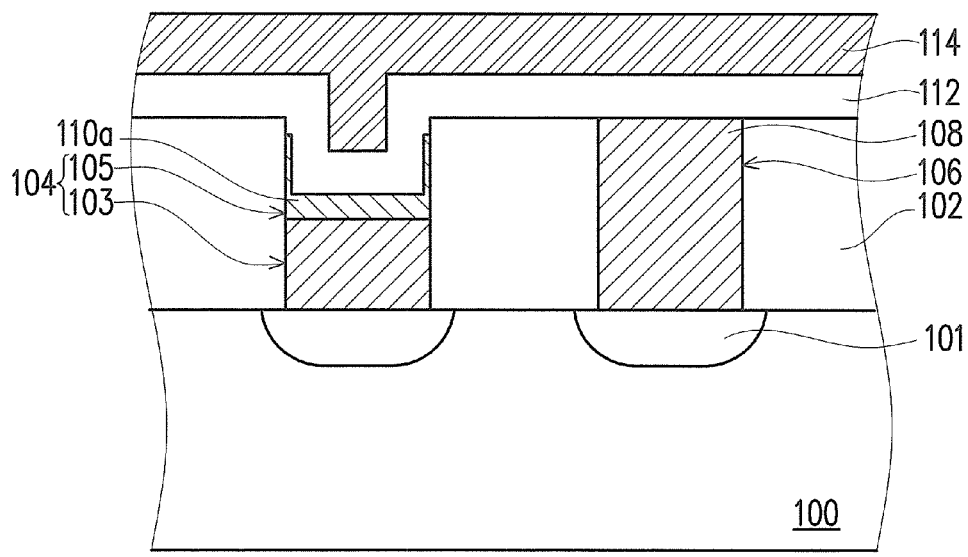

Referring to FIG. 1D, a variable resistance material layer 112 and a top electrode material layer 114 are sequentially formed on the substrate 100 filling in the upper opening 105. The variable resistance material layer 112 includes a transition metal oxide (e.g., $HfO_2$ or $ZrO_2$), and the forming method includes performing an atomic layer deposition (ALD) process. The top electrode material layer 114 includes titanium nitride (e.g., Ti/TiN), and the forming method includes performing an ALD process, a PVD process or a CVD process.

Figure 1E:
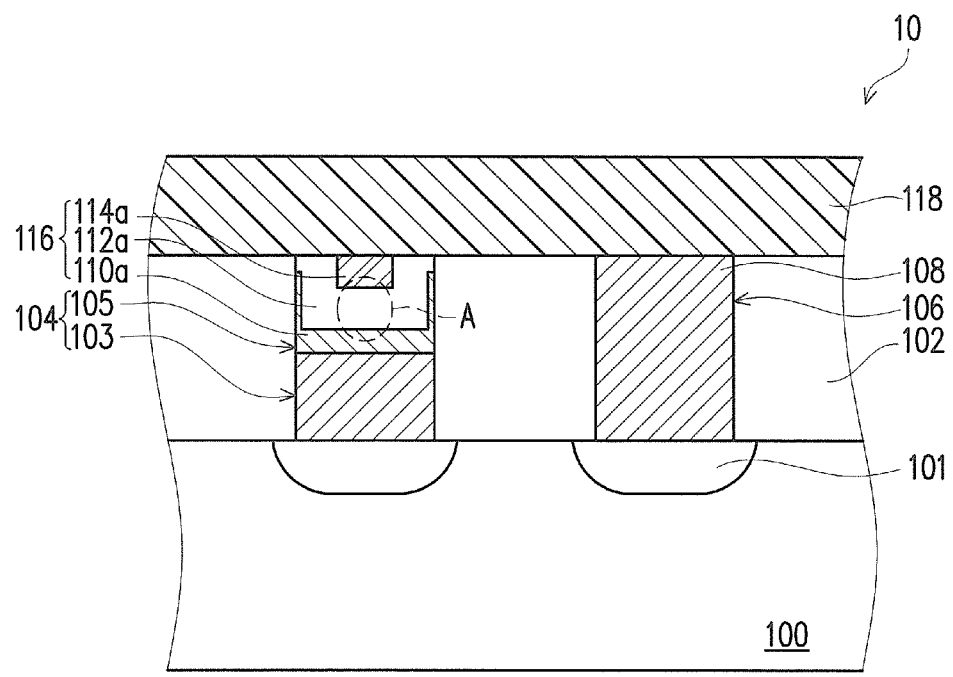

Referring to FIG. 1E, the variable resistance material layer 112 and the top electrode material layer 114 outside of the upper opening 105 are removed, so as to form a variable resistance layer 112a and a top electrode 114a. The bottom electrode 110a, the variable resistance layer 112a and the top electrode 114a form a variable resistance memory cell 116 of the present invention. The method of removing the variable resistance material layer 112 and the top electrode material layer 114 outside of the upper opening 105 includes performing a CMP process. It is noted that the removing step is implemented with a CMP process rather than a conventional etching back process, so that the antenna effect caused by accumulated charges during the etching back process can be avoided. Thereafter, a metal layer 118 is formed on the dielectric layer 102 to be electrically connected to the top electrode 114a and the conductive layer 108 within the second opening 106. The metal layer 118 includes Al—Cu alloy, and the forming method includes performing a CVD process. The resistance memory device 10 of the first embodiment is thus completed.

In the first embodiment, the variable resistance memory cell 116 including the bottom electrode 110a, the variable resistance layer 112a and the top electrode 114a is formed by deposition, etching/polishing processes. That is, the variable resistance memory cell 116 is formed through a self-aligned process without a photolithography step. Therefore, as compared to the case of the conventional method, the patterning step for forming the variable resistance memory cell 116 can be saved in the method of the present invention. Besides, the top electrode 114a is formed with a smaller area, so that the possible paths for filament formation can be reduced, and the variance of RRAM operation IV characteristics can be decreased.

The resistance memory device 10 of the present invention is illustrated below with reference to FIG. 1E. The resistance memory device 10 includes a dielectric layer 102, a conductive layer 108, a bottom electrode 110a, a variable resistance layer 112a and a top electrode 114a. The dielectric layer 102 is disposed on a substrate 100 and has a first opening 104 constituted by a lower opening 103 and an upper opening 105. The sidewall of the lower opening 103 is aligned with that of the upper opening 105. The conductive layer 108 fills up the lower opening 103. The conductive layer 108 is electrically connected to another conductive layer (e.g., a doped region 101) disposed below the dielectric layer 102. The bottom electrode 110a is disposed on the bottom and on at least a portion of the sidewall of the upper opening 105. In this embodiment, the bottom electrode 110a exposes the top portion of the sidewall of the upper opening 105. The top electrode 114a is disposed in the upper opening 105. The variable resistance layer 112a is disposed between the bottom electrode 110a and the top electrode 114a.

It is noted that in this embodiment, the bottom electrode 110a exposes the top portion of the sidewall of the upper opening 105. With such arrangement, a short caused by overly proximity of the bottom electrode 110a to the top electrode 114a at top of the upper opening 105 can be avoided. Besides, the bottom electrode 110a is thinner on the sidewall but thicker on the bottom of the upper opening 105, so that the operation region A of the variable resistance memory cell 116 can be limited to the block with the shortest path between the bottom electrode 110a and the top electrode 114a, as shown in FIG. 1E.

Moreover, in the first embodiment, the dielectric layer 102 further has a second opening 106, and the conductive layer 108 further fills up the second opening 106. Besides, the resistance memory device 10 further includes a metal layer 118 disposed on the dielectric layer 102 and electrically connected to the top electrode 114a and the conductive layer 108 within the second opening 106.

Second Embodiment

FIG. 2A to FIG. 2E schematically illustrate cross-sectional views of a method of forming a resistance memory device according to a second embodiment of the present invention.

Figure 2A:
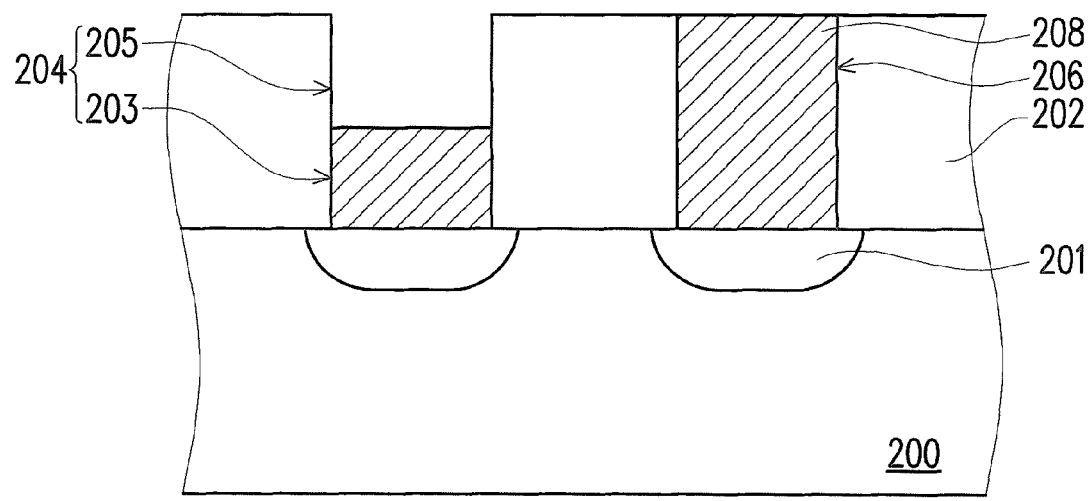
FIG. 2A to FIG. 2E schematically illustrate cross-sectional views of a method of forming a resistance memory device according to a second embodiment of the present invention.

Referring to FIG. 2A, a dielectric layer 202 is formed on a substrate 200. The dielectric layer 202 has a first opening 204 and a second opening 206, both of which penetrate through the dielectric layer 202. The first opening 204 is constituted by a lower opening 203 and an upper opening 205, and the sidewall of the lower opening 203 is aligned with that of the upper opening 205. Thereafter, a conductive layer 208 fills in the first opening 204 and the second opening 206. The conductive layer 208 fills up the second opening 206 and the lower opening 203 of the first opening 204. Furthermore, the conductive layer 208 can be electrically connected to another conductive layer (e.g., a doped region 201) disposed below the dielectric layer 202.

Figure 2B:
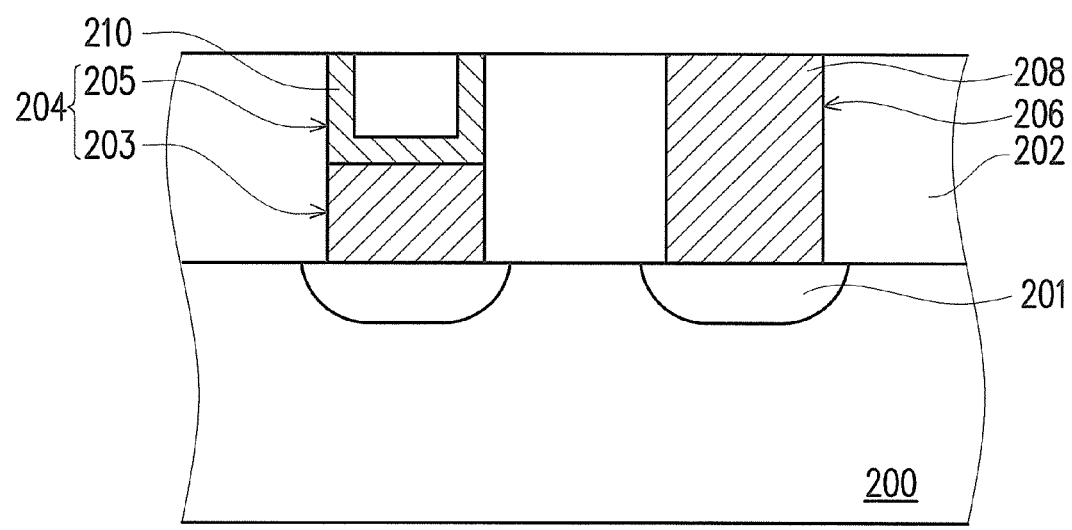

Referring to FIG. 2B, a bottom electrode 210 is formed on the bottom and the entire sidewall of the upper opening 205. The method of forming the bottom electrode 210 includes forming a bottom electrode material layer (not shown) conformally on the substrate 200. The bottom electrode material layer includes titanium nitride, and the forming method includes performing a CVD process. In this embodiment, the thickness of the bottom electrode material layer on the sidewall of the upper opening 205 is substantially the same as that on the bottom of the upper opening 205. Thereafter, the bottom electrode material layer outside of the upper opening 205 is removed.

Figure 2C:
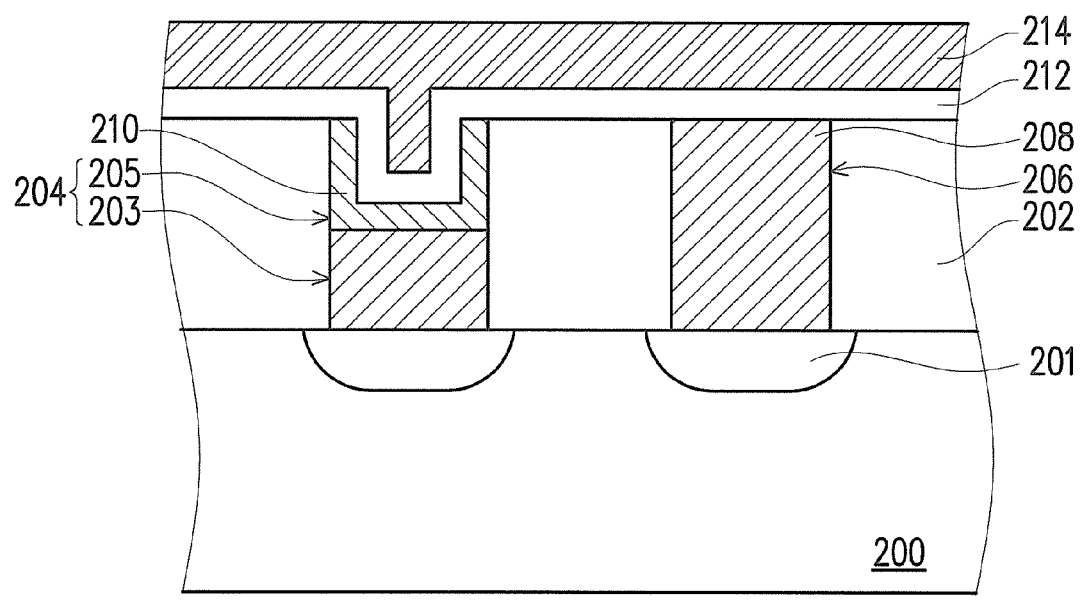

Referring to FIG. 2C, a variable resistance material layer 212 and a top electrode material layer 214 are sequentially formed on the substrate 200 filling in the upper opening 205. The variable resistance material layer 212 includes a transition metal oxide (e.g., $HfO_2$ or $ZrO_2$), and the forming method includes performing an ALD process. The top electrode material layer 214 includes titanium nitride (e.g., Ti/TiN), and the forming method includes performing an ALD process, a PVD process or a CVD process.

Figure 2D:
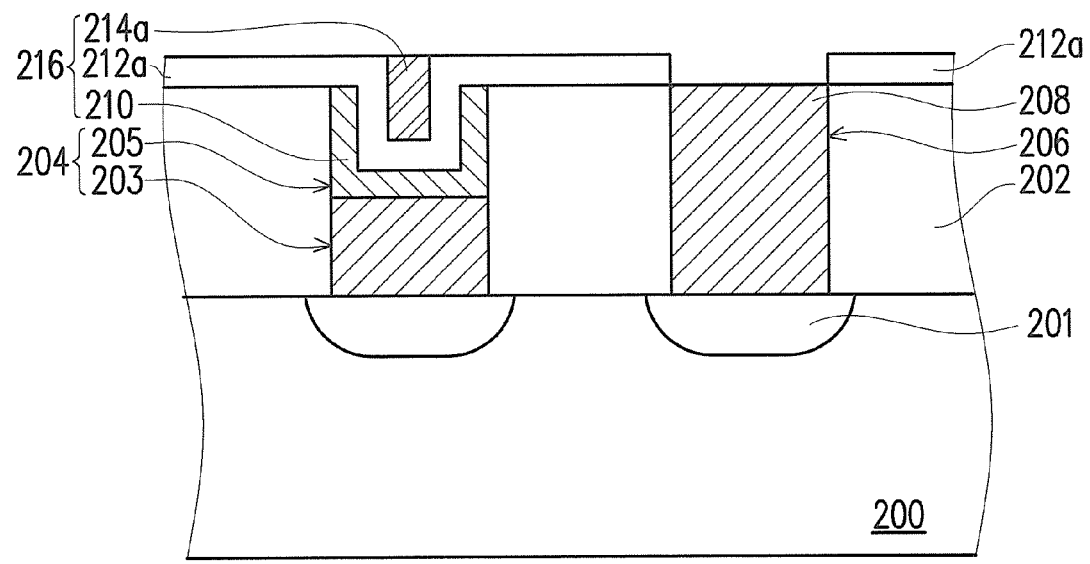

Referring to FIG. 2D, the top electrode material layer 214 outside of the upper opening 205 is removed to faun a top electrode 214a. The method of removing the top electrode material layer 214 outside of the upper opening 205 includes performing a CMP process with the variable resistance material layer 212 as a polishing stop layer. It is noted that the removing step is implemented with a CMP process rather than a conventional etching back process, so that the antenna effect caused by accumulated charges during the etching back process can be avoided.

Thereafter, a portion of the variable resistance material layer 212 is removed to form a resistance memory layer 212a exposing the second opening 206. Specifically, the variable resistance layer 212a is disposed along the inner wall of the upper opening 205 and extends onto the dielectric layer 202 around the upper opening 205. The method of removing the portion of the variable resistance material layer 212 includes performing a photolithography/etching patterning process. The bottom electrode 210, the variable resistance layer 212a and the top electrode 214a form a variable resistance memory cell 216 of the present invention.

Figure 2E:
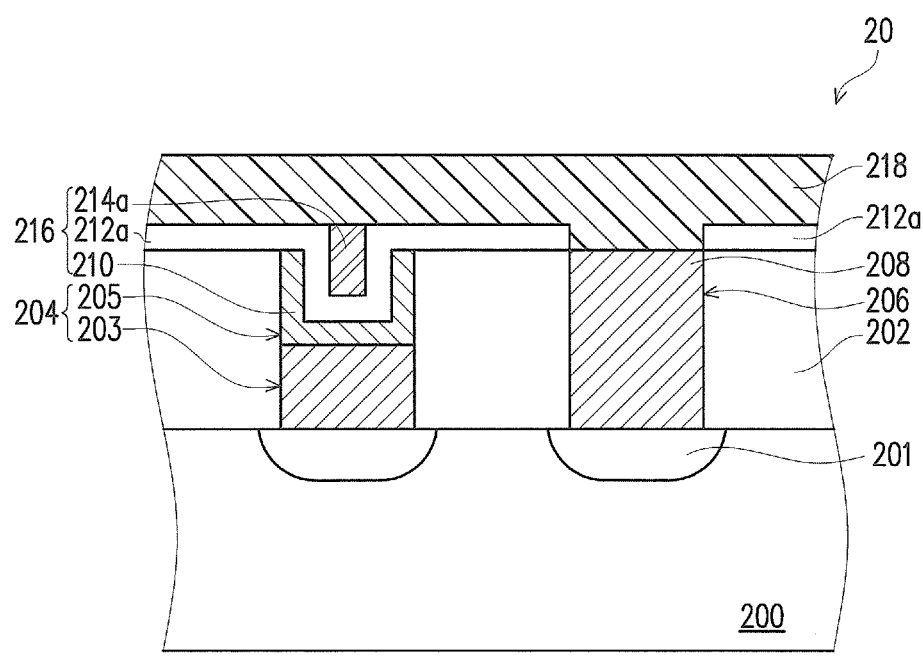

Referring to FIG. 2E, a metal layer 218 is formed on the dielectric layer 202 to be electrically connected to the top electrode 214a and the conductive layer 208 within the second opening 206. The metal layer 218 includes Al—Cu alloy, and the forming method includes performing a CVD process or a PVD process. The resistance memory device 20 of the second embodiment is thus completed.

In the second embodiment, the variable resistance memory cell 216 including the bottom electrode 210, the variable resistance layer 212a and the top electrode 214a is formed by deposition, etching/polishing processes. That is, the variable resistance memory cell 216 is formed through a self-aligned process without a photolithography step. Besides, the top electrode 214a is foamed with a smaller area, so that the possible paths for filament formation can be reduced, and the variance of RRAM operation IV characteristics can be decreased.

The resistance memory device 20 of the present invention is illustrated below with reference to FIG. 2E. The resistance memory device 20 includes a dielectric layer 202, a conductive layer 208, a bottom electrode 210, a variable resistance layer 212a and a top electrode 214a. The dielectric layer 202 is disposed on a substrate 200 and has a first opening 204 constituted by a lower opening 203 and an upper opening 205. The sidewall of the lower opening 203 is aligned with that of the upper opening 205. The conductive layer 208 fills up the lower opening 203. The conductive layer 208 is electrically connected to another conductive layer (e.g., a doped region 201) disposed below the dielectric layer 202. The bottom electrode 210 is disposed on the bottom and on the entire sidewall of the upper opening 205. The top electrode 214a is disposed in the upper opening 205. The variable resistance layer 212a is disposed between the bottom electrode 210 and the top electrode 214a.

Moreover, in the second embodiment, the dielectric layer 202 further has a second opening 206, and the conductive layer 208 further fills up the second opening 206. Besides, the resistance memory device 20 further includes a metal layer 218 disposed on the dielectric layer 202 and electrically connected to the top electrode 214a and the conductive layer 208 within the second opening 206.

In summary, since the resistance memory device of the present invention is formed through a self-aligned process, the conventional alignment error can be avoided, and the requirement for smaller device dimension can be easily achieved. Besides, the resistance memory device of the present invention is formed with a smaller top electrode, so that the possible paths for filament formation can be reduced, and the variance of RRAM operation IV characteristics can be decreased.

The present invention has been disclosed above in the preferred embodiments, but is not limited to those. It is known to persons skilled in the art that some modifications and innovations may be made without departing from the spirit and scope of the present invention. Therefore, the scope of the present invention should be defined by the following claims.

What is claimed is:

1. A resistance memory device, comprising:
   a dielectric layer, disposed on a substrate and has a first opening constituted by a lower opening and an upper opening;
   a conductive layer, filling up the lower opening;
   a bottom electrode, disposed on a bottom and on at least a portion of a sidewall of the upper opening;
   a top electrode, disposed in the upper opening; and a variable resistance layer, disposed between the bottom electrode and the top electrode, wherein the bottom electrode is disposed on the bottom and on the entire sidewall of the upper opening.

2. The resistance memory device of claim 1, wherein a sidewall of the lower opening is aligned with a sidewall of the upper opening.

3. The resistance memory device of claim 1, wherein a thickness of the bottom electrode on the sidewall of the upper opening is substantially the same as a thickness of the bottom electrode on the bottom of the upper opening.

4. The resistance memory device of claim 3, wherein the variable resistance layer is further disposed on the dielectric layer around the first opening.

5. The resistance memory device of claim 4, wherein the dielectric layer further has a second opening, and the conductive layer further fills up the second opening.

6. The resistance memory device of claim 5, wherein the variable resistance layer exposes the conductive layer within the second opening.

7. The resistance memory device of claim 5, further comprising a metal layer disposed on the dielectric layer and electrically connected to the top electrode and the conductive layer within the second opening.

8. The resistance memory device of claim 4, wherein the first opening and the second opening penetrate through the dielectric layer.

9. The resistance memory device of claim 1, wherein the conductive layer is electrically connected to another conductive layer disposed below the dielectric layer.

10. The resistance memory device of claim 9, wherein the another conductive layer comprises a doped region, a polysilicon layer or a metal layer.

* * * * *